United States Patent
Nonaka et al.

(10) Patent No.: US 11,462,409 B2
(45) Date of Patent: Oct. 4, 2022

(54) EPITAXIAL SILICON WAFER, AND METHOD FOR MANUFACTURING EPITAXIAL SILICON WAFER

(71) Applicant: SUMCO CORPORATION, Tokyo (JP)

(72) Inventors: Naoya Nonaka, Nagasaki (JP); Tadashi Kawashima, Albuquerque, NM (US); Katsuya Ookubo, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 5 days.

(21) Appl. No.: 16/323,438

(22) PCT Filed: Aug. 7, 2017

(86) PCT No.: PCT/JP2017/028620
§ 371 (c)(1),
(2) Date: Feb. 5, 2019

(87) PCT Pub. No.: WO2018/030352
PCT Pub. Date: Feb. 15, 2018

(65) Prior Publication Data
US 2019/0181007 A1 Jun. 13, 2019

(30) Foreign Application Priority Data

Aug. 10, 2016 (JP) .............................. JP2016-157965

(51) Int. Cl.
*H01L 21/20* (2006.01)
*C30B 29/06* (2006.01)
(Continued)

(52) U.S. Cl.
CPC .......... *H01L 21/2022* (2013.01); *C23C 16/24* (2013.01); *C30B 29/06* (2013.01);
(Continued)

(58) Field of Classification Search
CPC . H01L 21/2022; H01L 21/20; H01L 21/2003; H01L 21/2015; H01L 29/167; H01L 21/02381; C30B 29/06
(Continued)

(56) References Cited

U.S. PATENT DOCUMENTS

| 10,100,429 B2 | 10/2018 | Narushima et al. |
| 2003/0162371 A1* | 8/2003 | Udagawa ................ C30B 29/40 438/478 |

(Continued)

FOREIGN PATENT DOCUMENTS

| JP | S62-226891 A | 10/1987 |
| JP | 2004-091234 A | 3/2004 |

(Continued)

OTHER PUBLICATIONS

Notice of Reasons for Rejection for Japanese Patent Application No. JP 2018-533461, dated Nov. 19, 2019, and English-language translation thereof.

(Continued)

*Primary Examiner* — Thao X Le
*Assistant Examiner* — Gardner W. S. Swan
(74) *Attorney, Agent, or Firm* — Greenblum & Bernstein, P.L.C.

(57) ABSTRACT

An epitaxial silicon wafer includes: a silicon wafer doped with phosphorus as a dopant and having an electrical resistivity of less than 1.0 m$\Omega$·cm; and an epitaxial film formed on the silicon wafer. The silicon wafer includes: a main surface to which a (100) plane is inclined; and a [100] axis that is perpendicular to the (100) plane and inclined at an angle ranging from 0°30' to 0°55' in any direction with respect to an axis perpendicular to the main surface. The epitaxial silicon wafer has at most 1/cm$^2$ of a density of a hillock defect generated thereon.

2 Claims, 3 Drawing Sheets

(51) Int. Cl.
  *C23C 16/24* (2006.01)
  *H01L 21/205* (2006.01)
  *H01L 21/02* (2006.01)
  *H01L 29/167* (2006.01)

(52) U.S. Cl.
  CPC ........ *H01L 21/02381* (2013.01); *H01L 21/20* (2013.01); *H01L 21/205* (2013.01); *H01L 29/167* (2013.01)

(58) Field of Classification Search
  USPC .......................... 257/607; 438/478, 510, 758
  See application file for complete search history.

(56) References Cited

U.S. PATENT DOCUMENTS

| 2016/0102418 | A1 | 4/2016 | Narushima et al. |
| 2020/0027727 | A1* | 1/2020 | Nonaka ................. H01L 21/205 |

FOREIGN PATENT DOCUMENTS

| JP | 2004091234 A | * | 3/2004 | ....... H01L 21/02381 |
| JP | 2007-180270 A | | 7/2007 | |
| JP | 2007-532007 A | | 11/2007 | |
| JP | 2014-103333 A | | 6/2014 | |
| JP | 2014103333 A | * | 6/2014 | |
| JP | 112014002133 T5 | | 1/2016 | |
| WO | WO 2014/175120 A1 | | 10/2014 | |

OTHER PUBLICATIONS

International Search Report issued in International Bureau of WIPO Patent Application No. PCT/JP2017/028620, dated Oct. 3, 2017, together with an English translation.
International Preliminary Report on Patentability issued in International Bureau of WIPO Patent Application No. PCT/JP2017/028620, dated Feb. 12, 2019, together with an English translation.
Office Action for DE App. No. 112017004005.1 dated Oct. 23, 2020 (w/ translation).

* cited by examiner

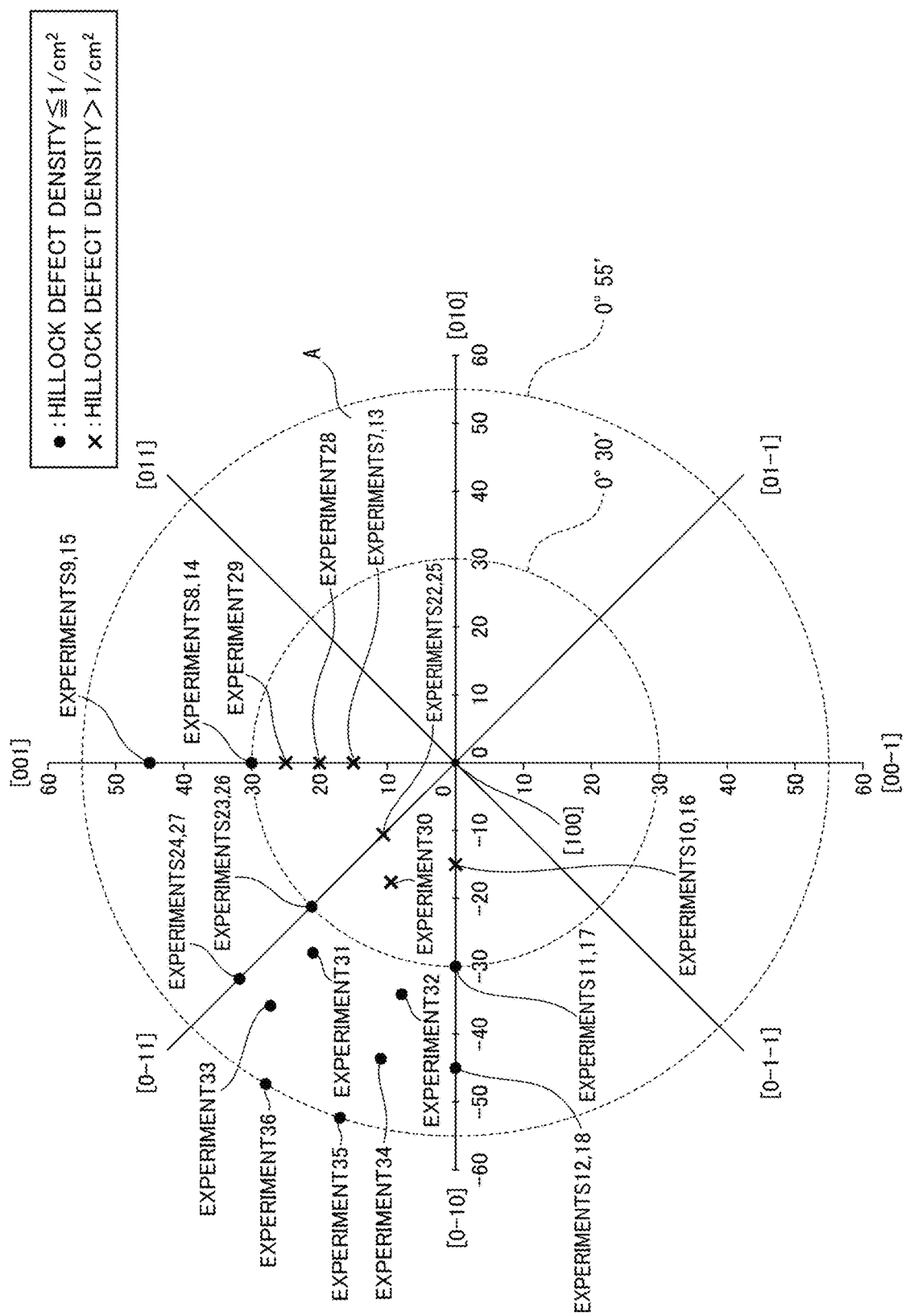

EPITAXIAL SILICON WAFER, AND METHOD FOR MANUFACTURING EPITAXIAL SILICON WAFER

TECHNICAL FIELD

The present invention relates to an epitaxial silicon wafer and a manufacturing method of the epitaxial silicon wafer.

BACKGROUND ART

Study for preventing generation of defects on an epitaxial silicon wafer has been conventionally done (see, for instance, Patent Literature 1).

Patent Literature 1 discloses that an epitaxial film is formed on a silicon wafer having a main surface approximately parallel to a (100) plane, in which the main surface is inclined to a <100>crystal axis at the following angle θ in a [011] direction or a [0-1-1] direction and at the following angle φ in a [01-1] direction or a [0-11] direction:

$$5' \leq \theta \leq 2°, \varphi \leq 10', \text{ or } 5' \leq \varphi \leq 2°, \theta \leq 10'.$$

CITATION LIST

Patent Literature(s)

Patent Literature 1::JP 62-226891 A

SUMMARY OF THE INVENTION

Problem(s) to be Solved by the Invention

In recent years, a silicon wafer used for an epitaxial silicon wafer for a low voltage power MOSFET device has been required to have an electrical resistivity as extremely low as, for instance, less than 1.0 m Ω·cm. However, the epitaxial silicon wafer made of the silicon wafer having such an extremely low electrical resistivity may have many hillock defects generated thereon, the hillock defects being not observed at the electrical resistivity equal to or more than 1.0 m Ω·cm.

The inventors have found that the hillock defects have different properties from those of stacking faults (hereinafter, abbreviated as "SF") detected in an epitaxial film formed on a silicon wafer that is doped with phosphorus (P) as a dopant and has a low electrical resistivity, and that the hillock defects depend on a minute inclination angle of a substrate. Thus, the inventors have achieved the invention.

An object of the invention is to provide an epitaxial silicon wafer with a reduced generation of a hillock defect and a manufacturing method of the epitaxial silicon wafer.

Means for Solving the Problem(s)

According to an aspect of the invention, an epitaxial silicon wafer includes: a silicon wafer doped with a phosphorus as a dopant and having an electrical resistivity of less than 1.0 m Ω·cm, and an epitaxial film formed on the silicon wafer, the silicon wafer including: a main surface to which a (100) plane is inclined; and a [100] axis that is perpendicular to the (100) plane and inclined at an angle ranging from 0°30' to 0°55' in any direction with respect to an axis perpendicular to the main surface, the epitaxial silicon wafer having at most 1/cm² of a density of a hillock defect generated thereon.

According to another aspect of the invention, a manufacturing method of an epitaxial silicon wafer, in which the epitaxial silicon wafer includes: a silicon wafer doped with phosphorus as a dopant and having an electrical resistivity of less than 1.0 m Ω·cm; and an epitaxial film formed on the silicon wafer, includes: preparing the silicon wafer comprising a main surface to which a (100) plane is inclined and a [100] axis that is perpendicular to the (100) plane and inclined at an angle ranging from 0°30' to 0°55' in any direction with respect to an axis perpendicular to the main surface, and forming the epitaxial film on the silicon wafer.

The manufacturing method of the epitaxial silicon wafer in the above aspect of the invention provides a hillock defect density equal to or less than 1/cm², so that an epitaxial silicon wafer with a reduced generation of a hillock defect is obtainable.

In the manufacturing method of the epitaxial silicon wafer in the above aspect of the invention, the epitaxial film is preferably formed at a growth temperature ranging from 1030 degrees C. to less than 1100 degrees C.

When an epitaxial film is formed at a growth temperature of 1100 degrees C. or more on the silicon wafer doped with phosphorus at a high concentration so as to have the electrical resistivity of less than 1.0 m Ω·cm, many SF may be generated.

According to the above aspect of the invention, since the epitaxial film is formed at the growth temperature ranging from 1030 degrees C. to less than 1100 degrees C., an epitaxial silicon wafer with a reduced generation of hillock defects and SF is obtainable.

BRIEF DESCRIPTION OF DRAWING(S)

FIG. 3 shows a relationship among the inclination directions of the [100] axis, the inclination angles of the [100] axis, and a hillock defect density in Examples of the invention having the substrate resistivity of 0.8 m Ω·cm or 0.6 m Ω·cm.

DESCRIPTION OF EMBODIMENT(S)

Exemplary Embodiment(s)

An exemplary embodiment of the invention will be described below with reference to the attached drawings.

Arrangement of Epitaxial Silicon Wafer

Figure 1A:
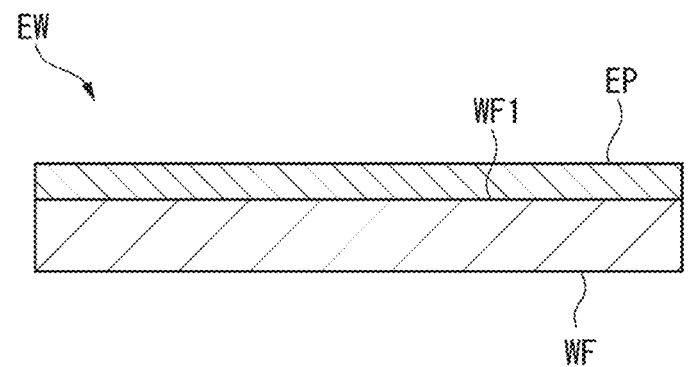
FIG. 1A is a cross-sectional view showing an epitaxial silicon wafer according to an exemplary embodiment of the invention.

As shown in FIG. 1A, an epitaxial silicon wafer EW includes a silicon wafer WF and an epitaxial film EP formed on the silicon wafer WF.

Figure 1B:
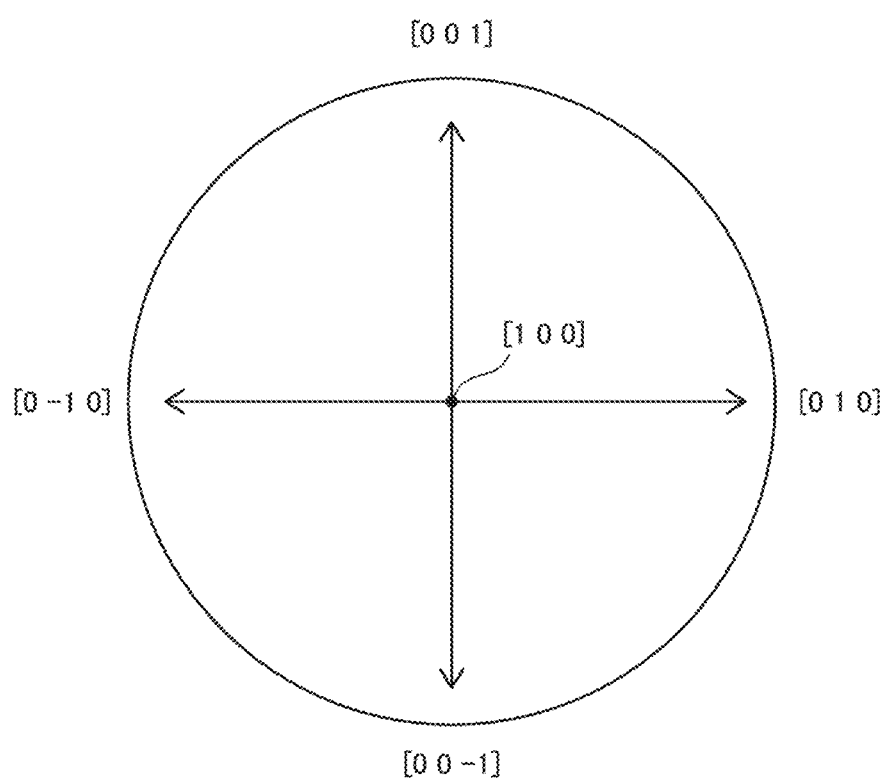
FIG. 1B is an illustration of inclination directions of a [100] axis.

The silicon wafer WF has a diameter ranging from 199.8 mm to 200.2 mm and contains red phosphorus so as to have an electrical resistivity of less than 1.0 m Ω·cm. The silicon wafer WF has a main surface WF1 to which a (100) plane is inclined, and a [100] axis perpendicular to the (100) plane is inclined to an axis perpendicular to the main surface WF1 at an angle ranging from 0°30' to 0°55' in any direction of a [001] direction, [00-1] direction, [010] direction and [0-10] direction as shown in FIG. 1B.

Figure 2:
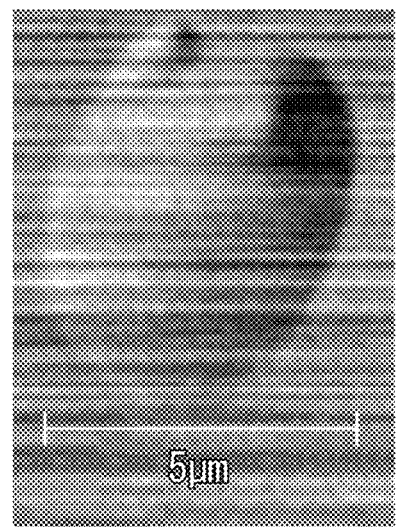
FIG. 2 is a photograph of a hillock defect.

A density of a hillock defect (hereinafter also referred to as a hillock defect density") per one epitaxial silicon wafer EW having the above arrangement is at most 1/cm², The hillock defect is measurable with, for instance, a surface inspection device (product name "Magics" manufactured by Lasertec Corporation). As shown in a photograph of FIG. 2, the hillock defect has a substantially circular shape whose size ranges from 3 μm to 10 μm with a projection slightly projecting from a surface of the epitaxial film. The shape of the hillock defect is different from a shape of SF generated on the epitaxial film by micro pits caused by clusters of oxygen and red phosphorus and a shape of a defect generated on the epitaxial film caused by COP (Crystal Originated Particle) of the substrate.

Herein, it is presumed as follows why the number of the hillock defect is decreased at the inclination angle of the [100] axis defined within the above range.

In general, for growth of the epitaxial film, a silicon atom fed during epitaxial growth is adsorbed on Terrace and moves to an energetically stable Step. The silicon atom further moves to an energetically stable Kink to promote Step. The epitaxial growth is thus conducted.

Accordingly, it is presumed that, at the inclination angle of the [100] axis as small as less than 0°30', the fed silicon atom cannot reach Step and Kink due to a wide width of Terrace and is trapped in micro pits caused by clusters (micro deposits) of oxygen and phosphorus, the clusters formed on a surface of Terrace, so that a hillock defect is generated by anomalous formation with the silicon atom as a growth nucleus, On the other hand, at the inclination angle of the [100] axis as large as 0°30' or more, the fed silicon atom can easily reach Step and Kink due to a narrow width of Terrace, thereby decreasing the hillock defect.

At the inclination angle of the [100] axis exceeding 0°55', the quality of the epitaxial film (e.g., a surface roughness) may be deteriorated depending on an inclination direction, so that a channeling phenomenon at ion injection may be changed to affect device properties. For this reason, the inclination angle of the [100] axis is preferably 0°55' or less.

Manufacturing Method of Epitaxial Silicon Wafer

Next, a manufacturing method of the epitaxial silicon wafer EW will be described.

Firstly, the silicon wafer WF having the above arrangement is prepared. In order to obtain the silicon wafer WF, monocrystalline silicon containing red phosphorus so as to have the electrical resistivity from 0.5 m Ω·cm to less than 1.0 m Ω·cm and having a center axis coaxial with a [001] axis perpendicular to the (100) plane is manufactured. The monocrystalline silicon may be sliced not along a plane perpendicular to the center axis but along a plane inclined to the perpendicular plane. Alternatively, monocrystalline silicon whose center axis is inclined at an angle ranging from 0°30' to 0°55' in any direction with respect to the [100] axis perpendicular to the (100) plane may be manufactured and sliced along the plane perpendicular to the center axis.

Exemplary manufacturing conditions of the monocrystalline silicon are shown as follows.

red phosphorus concentration: from $7.38 \times 10^{19}$ atoms/cm$^3$ to $1.64 \times 10^{20}$ atoms/cm$^3$ oxygen concentration: from $2 \times 10^{17}$ atoms/cm$^3$ to $20 \times 10^{17}$ atoms/cm$^3$ The obtained silicon wafer WF is subjected, as needed, to lapping, chemical etching, mirror surface polishing, and the like.

Subsequently, the epitaxial film EP is formed on one surface of the silicon wafer Any method of forming the epitaxial film EP is usable. Any known vapor film deposition method and vapor deposition apparatus are usable to allow vapor phase growth of the epitaxial film EP required for a substrate for manufacturing a semiconductor device. Source gas and film formation conditions may be suitably selected depending on the selected method and apparatus.

Exemplary film formation conditions of the epitaxial film EP are shown as follows.

Dopant Gas: phosphine (PH$_3$) gas
Material Source Gas: trichlorosilane (SiHCl$_3$) gas
Carrier Gas: hydrogen gas
Growth Temperature: from 1030 degrees C. to less than 1100 degrees C.
Epitaxial Film Thickness: from 0.1 µm to 10 µm
Electrical Resistivity of Epitaxial Film: from 0.01 Ω·cm to 10 Ω·cm When the silicon wafer has a diameter of 200 mm or more, an epitaxial reactor is preferably a single-wafer reactor ith lamp heating. This arrangement also can reduce misfit dislocation concurrently occurring due to thermal stress.

Example(s)

Next, the invention will be described in more detail with reference to Examples and Comparatives. However, the invention is by no means limited thereto.

Manufacturing Method of Epitaxial Silicon Wafer

Experiment 1

Firstly, a silicon wafer was prepared to have an electrical resistivity (substrate resistivity) of 1.0 m Ω·cm and include: a main surface to which a (100) plane was inclined; and a [100] axis that was perpendicular to the (100) plane and inclined at an angle of 0°15' in a [001] direction with respect to an axis perpendicular to the main surface. A diameter of the silicon wafer was 200 mm.

In order to obtain the above silicon wafer, monocrystalline silicon having a center axis coaxial with the [100] axis was manufactured under the following manufacturing conditions, and the obtained monocrystalline silicon was sliced not along a plane perpendicular to the center axis but along a plane inclined to the perpendicular plane.

Red Phosphorus Concentration: $7.38 \times 10^{19}$ atoms/cm$^3$
Oxygen Concentration: $7.4 \times 10^{17}$ atoms/cm$^3$ An epitaxial film was grown on the silicon wafer under the following conditions to obtain a sample of Experiment 1.

Dopant Gas: phosphine (PH$_3$) gas
Material Source Gas: trichlorosilane (SiHCl$_3$) gas
Carrier Gas: hydrogen gas
Growth Temperature: 1040 degrees C. (from 1030 degrees C. to 1050 degrees C.)
Epitaxial Film Thickness: 5 µm
Electrical Resistivity of Epitaxial Film: 0.2 0 Ω·cm Experiments 2 to 6

Samples of Experiments 2 and 3 were obtained by performing the processes under the same conditions as in Experiment 1 except that the slicing condition of the monocrystalline silicon was changed to prepare silicon wafers having the [100] axis that was perpendicular to the (100) plane and inclined at the respective angles of 0°30' and 0°45' in the same direction as in Experiment 1 with respect to the axis perpendicular to the main surface as shown in Table 1.

Samples of Experiments 4, 5 and 6 were obtained by performing the processes under the same conditions as in Experiments 1, 2 and 3 except that the slicing condition of the monocrystalline silicon was changed to prepare silicon wafers having the respective [100] axes that were perpendicular to the (100) plane and inclined at the same angles of Experiments 1, 2 and 3 in a [0-10] direction with respect to the axis perpendicular to the main surface.

Experiments 7 to 18

Samples of Experiments 7 to 18 were obtained by performing the processes under the same conditions as in Experiments 1 to 6 except that the red phosphorus concentration of monocrystalline silicon was adjusted to provide the substrate resistivity of 0.8 m Ω·cm or 0.6 m Ω·cm to the monocrystalline silicon as shown in Tables 1 and 2.

Experiments 19 to 27

Samples of Experiments 19 to 21, 22 to 24, and 25 to 27 were obtained by performing the processes under the same conditions as in Experiments 1 to 3, 7 to 9, and 13 to 15 respectively, except that the slicing condition of the monocrystalline silicon was changed to prepare silicon wafers having the respective [100] axes that were perpendicular to the (100) plane and inclined at the same angles of Experiments 1 to 3, 7 to 9, and 13 to 15 in a [0-11] direction with respect to the axis perpendicular to the main surface as shown in Tables 1 and 2.

Experiments 28 and 29

Samples of Experiments 28 and 29 were obtained by performing the processes under the same conditions as in Experiment 13 except that the slicing condition of the monocrystalline silicon was changed to prepare silicon wafers having the respective [100] axes that were perpendicular to the (100) plane and inclined at the angles of 0°20' and 0°25' in the same direction as in Experiment 13 with respect to the axis perpendicular to the main surface as shown in Table 2.

Experiments 30 to 36

Samples of Experiments 30 to 36 were obtained by performing the processes under the same conditions as in Experiment 25 except that the slicing condition of the monocrystalline silicon was changed to prepare silicon wafers having the [100] axes that were perpendicular to the (100) plane and inclined at angles of 0°20', 0°35', 0°45' and 0°55' in a predetermined compound angle direction between the [0-11] direction and the [0-10] direction with respect to the axis perpendicular to the main surface as shown in Table 2. The "predetermined compound angle between the [0-11] direction and the [0-10] direction" means a compound angle of an angle in the [0-10] direction and an angle in the [001] direction.

Evaluation

Each of the samples of Experiments 1 to 36 was subjected to a surface inspection using a surface inspection device (product name "Magics" manufactured by Lasertec Corporation) and evaluated in terms of a hillock defect density. Results are shown in Tables 1 and 2.

As shown in Tables 1 and 2, the hillock defect density in Experiments 7, 10, 13, 16, 22, 25 and 28 to 30 exceeded 1/cm$^2$ while the hillock defect density in the rest of Experiments was equal to or less than 1/cm$^2$.

This behavior is considered different from SF generated on the epitaxial film. by micro pits caused by clusters of oxygen and red phosphorus, and significantly depends on an orientation of a micro plane of a crystal although a detailed generation mechanism of hillock defects is not revealed.

Accordingly, Experiments 8, 9, 11, 12, 14, 15, 17, 18, 23, 24, 26, 27 and 31 to 36, in each of which the substrate resistivity is less than 1.0 m Ω·cm and the hillock defect density is equal to or less than 1/cm$^2$, correspond to Examples of the invention. Experiments 7, 10, 13, 16, 22, 25, 28, 29 and 30, in each of which the substrate resistivity is less than 1.0 m Ω·cm and the hillock defect density exceeds 1/cm$^2$, correspond to Comparatives of the invention.

FIG. 3 shows a relationship among Experiments 7 to 18 and 22 to 36 (with the substrate resistivity of 0.8 m Ω·cm or 0.6 m Ω·cm) in terms of the inclination direction of the [100] axis, the inclination angle of the [100] axis, and the hillock defect density.

In FIG. 3, [100] represents the [100] axis and [001], [011], [010], [014], [004], [0-1-1], [0-10] and [0-11] represent the inclination directions. Two concentric circles shown by a dashed line respectively represent the inclination angles 0° 30' and 0° 55' starting from the inner circle. · represents the hillock defect density equal to or less than 1/cm$^2$. x represents the hillock defect density exceeding 1/cm$^2$.

As shown in Tables 1 and 2 and FIG. 3, it has been found that an epitaxial silicon wafer with a reduced generation of the hillock defect is obtainable by forming an epitaxial film at the growth temperature ranging from 1030 degrees C. to less than 1100 degrees C. on a silicon wafer having a main surface to which a (100) plane is inclined and a [100] axis that is perpendicular to the (100) plane and inclined at an angle ranging from 0° 30' to 0° 55' in a [001] direction, [0-10] direction, [0-11] direction, and a predetermined compound angle direction between the [0-11] direction and the [0-10] direction with respect to an axis perpendicular to the main surface.

Since the [001] direction, [010] direction, [00-1] direction and [0-10] direction are equivalent to each other and the [011] direction, [01-1] direction, [0-1-1] direction and [0-11] direction are equivalent to each other, even when the [100] axis is inclined in any direction, the same results as in Examples 1 to 36 are obtainable.

Accordingly, the same effects as those in Experiments 8, 9, 11, 12, 14, 15, 17, 18, 23, 24, 26, 27 and 31 to 36 are obtainable by forming the epitaxial film at the growth temperature ranging from 1030 degrees C. to less than 1100 degrees C. on the silicon wafer having the main surface to which a (100) plane is inclined and the [100] axis that is perpendicular to the (100) plane and inclined at an angle ranging from 0°30' to 0°55' in any direction with respect to the axis perpendicular to the main surface, specifically, the silicon wafer being inclined at any angle in any direction included in a region A defined between the circle representing 0°30' and the circle representing 0°55' in FIG. 3.

Further, the same effects are also obtainable by using a silicon wafer having a inclined main surface equivalent to the (100) plane in which an axis equivalent to the [100] axis is inclined to an axis perpendicular to the main surface in a direction equivalent to each of the [00-1] direction, [010] direction, [01-1] direction, and a predetermined compound angle direction between the [0-11] direction and the [0-10] direction.

Experiments 1 to 6 and 19 to 21, in which the substrate resistivity is equal to or more than 1.0 m Ω·cm, correspond to Reference Examples of the invention. It has been found that the hillock defect density of each of Experiments 1 to 6 and 19 to 21 is equal to or less than 1/cm$^2$ even at the inclination angle of less than 0° 30'.

Although not shown in Tables 1 and 2, samples of Experiments 37 to 72 were obtained by performing the processes under the same conditions as in Experiments 1 to 36 except that an epitaxial film was formed at the growth temperature of 1100 degrees C. on each of silicon wafers manufactured under the same conditions as in Experiments 1 to 36.

Each of the samples of Experiments 37 to 72 was subjected to surface inspection in the same manner as in Experiments 1 to 36. All the samples were observed to show the hillock defect density equal to or less than 1/cm$^2$.

It has been found based on this observation that the hillock defect density is equal to or less than 1/cm$^2$ at the growth temperature of 1100 degrees C. or more even when the substrate resistivity is less than 1.0 m Ω·cm and the inclination angle is less than 0°30'.

TABLE 1

| | substrate resistivity (mΩ · cm) | inclination direction | inclination angle | hillock defect density (piece/cm$^2$) |
|---|---|---|---|---|
| Experiment 1 | 1.0 | | 0° 15' | 0.02 |
| Experiment 2 | | [0 0 1] | 0° 30' | 0.04 |
| Experiment 3 | | | 0° 45' | 0.01 |
| Experiment 19 | | | 0° 15' | 0.01 |
| Experiment 20 | | [0 -1 1] | 0° 30' | 0.01 |
| Experiment 21 | | | 0° 45' | 0.01 |
| Experiment 4 | | | 0° 15' | 0.01 |
| Experiment 5 | | [0 -1 0] | 0° 30' | 0.06 |
| Experiment 6 | | | 0° 45' | 0.01 |
| Experiment 7 | 0.8 | | 0° 15' | 12.80 |
| Experiment 8 | | [0 0 1] | 0° 30' | 0.04 |
| Experiment 9 | | | 0° 45' | 0.05 |
| Experiment 22 | | | 0° 15' | 12.33 |
| Experiment 23 | | [0 -1 1] | 0° 30' | 0.04 |
| Experiment 24 | | | 0° 45' | 0.04 |
| Experiment 10 | | | 0° 15' | 3.37 |
| Experiment 11 | | [0 -1 0] | 0° 30' | 0.01 |
| Experiment 12 | | | 0° 45' | 0.02 |

TABLE 2

|  | substrate resistivity (mΩ·cm) | inclination direction | inclination angle | [0 −1 0] direction angle | [0 0 1] direction angle | hillock defect density (piece/cm²) |
|---|---|---|---|---|---|---|
| Experiment 13 | 0.6 | [0 0 1] | 0° 15' | — | — | 10.89 |
| Experiment 28 | | | 0° 20' | — | — | 18.77 |
| Experiment 29 | | | 0° 25' | — | — | 2.39 |
| Experiment 14 | | | 0° 30' | — | — | 0.06 |
| Experiment 15 | | | 0° 45' | — | — | 0.04 |
| Experiment 25 | | [0 −1 1] | 0° 15' | — | — | 32.75 |
| Experiment 26 | | | 0° 30' | — | — | 0.06 |
| Experiment 27 | | | 0° 45' | — | — | 0.03 |
| Experiment 30 | | a predetermined | 0° 20' | 0° 19' | 0° 10' | 13.12 |
| Experiment 31 | | compound angle | 0° 35' | 0° 28' | 0° 21' | 0.02 |
| Experiment 32 | | direction between | 0° 35' | 0° 35' | 0° 8' | 0.01 |
| Experiment 33 | | [0 −1 1] | 0° 45' | 0° 34' | 0° 26' | 0.01 |
| Experiment 34 | | direction and | 0° 45' | 0° 45' | 0° 11' | 0.01 |
| Experiment 35 | | [0 − 1 0] | 0° 55' | 0° 53' | 0° 17' | 0.01 |
| Experiment 36 | | direction | 0° 55' | 0° 48' | 0° 28' | 0.02 |
| Experiment 16 | | [0 −1 0] | 0° 15' | — | — | 1.87 |
| Experiment 17 | | | 0° 30' | — | — | 0.05 |
| Experiment 18 | | | 0° 45' | — | — | 0.02 |

The invention claimed is:

1. A manufacturing method of an epitaxial silicon wafer, the epitaxial silicon wafer comprising:
    a silicon wafer having an electrical resistivity of less than 1.0 mΩ·cm that is doped with phosphorus as a dopant, the silicon wafer comprising a main surface to which a (100) plane is inclined; and
    an epitaxial film formed on the silicon wafer by supplying silicon atoms, the manufacturing method comprising:
    preparing the silicon wafer having an inclination angle of a [100] axis that is perpendicular to the (100) plane with respect to an axis perpendicular to the main surface ranging from 0° 30' to 0° 55' so that a hillock defect density is equal to or less than 1/cm²; and
    forming the epitaxial film on the silicon wafer.

2. The manufacturing method of the epitaxial silicon wafer according to claim 1, wherein the epitaxial film is formed at a growth temperature ranging from 1030 degrees C. to less than 1100 degrees C.

* * * * *